(12) United States Patent
Cho et al.

(10) Patent No.: US 7,699,999 B2
(45) Date of Patent: Apr. 20, 2010

(54) THICK FILM GETTER PASTE COMPOSITIONS FOR USE IN MOISTURE CONTROL

(75) Inventors: Yong Cho, Seoul (KR); Terri Cardellino, Santa Barbara, CA (US); James Daniel Tremel, Santa Barbara, CA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/210,300

(22) Filed: Sep. 15, 2008

(65) Prior Publication Data

US 2009/0045377 A1 Feb. 19, 2009

Related U.S. Application Data

(62) Division of application No. 10/712,670, filed on Nov. 13, 2003, now Pat. No. 7,438,829.

(51) Int. Cl.
*H01J 1/56* (2006.01)
*H01J 35/20* (2006.01)
*H01J 7/18* (2006.01)
*C03C 8/02* (2006.01)
*C03C 8/16* (2006.01)

(52) U.S. Cl. .............. 252/181.1; 252/181.6; 252/181.7; 252/194; 501/14; 501/15; 501/16; 501/17; 501/21; 501/32; 501/77

(58) Field of Classification Search .............. 252/181.1, 252/181.6; 501/14, 15, 16, 17
See application file for complete search history.

(56) References Cited

U.S. PATENT DOCUMENTS

| | | | |
|---|---|---|---|
| 275,613 A | 4/1883 | Edison | |
| 1,626,682 A | 5/1927 | MacRae | |
| 1,655,248 A | 1/1928 | Sharp | |
| 2,295,694 A | 9/1942 | Slack et al. | |
| 3,235,089 A * | 2/1966 | Burroughs | 210/510.1 |
| 3,338,034 A | 8/1967 | Hemstreet | |
| 3,414,417 A * | 12/1968 | Miller et al. | 524/46 |
| 3,598,761 A * | 8/1971 | Woulbroun et al. | 252/514 |
| 4,424,144 A | 1/1984 | Pryor et al. | |
| 4,615,823 A * | 10/1986 | Tokuyama et al. | 252/194 |
| 5,244,707 A | 9/1993 | Shores | |
| 5,401,706 A | 3/1995 | Fischer | |
| 5,434,472 A | 7/1995 | van den Boom | |
| 5,460,796 A | 10/1995 | Verduijin | |
| 5,498,925 A | 3/1996 | Bell et al. | |
| 5,591,379 A | 1/1997 | Shores | |
| 5,633,559 A * | 5/1997 | Hens et al. | 313/408 |
| 6,004,477 A | 12/1999 | Nakagawa et al. | |
| 6,226,890 B1 | 5/2001 | Boroson et al. | |
| 6,245,699 B1 * | 6/2001 | Hudecek et al. | 501/18 |
| 6,483,238 B1 * | 11/2002 | Baret et al. | 313/582 |
| 6,548,040 B1 | 4/2003 | Rouleau et al. | |
| 6,848,964 B1 * | 2/2005 | Sasaki et al. | 445/25 |
| 6,875,463 B2 * | 4/2005 | Mifune et al. | 427/64 |
| 7,214,429 B2 * | 5/2007 | Kato et al. | 428/406 |
| 7,309,669 B2 * | 12/2007 | Sumi et al. | 501/32 |
| 7,494,604 B2 * | 2/2009 | Cho et al. | 252/181.6 |
| 7,569,505 B2 * | 8/2009 | Besinger et al. | 501/79 |
| 2001/0054871 A1 * | 12/2001 | Tadaki et al. | 313/586 |
| 2002/0017864 A1 * | 2/2002 | Watanabe et al. | 313/586 |
| 2002/0041845 A1 | 4/2002 | Oku et al. | |
| 2002/0046861 A1 * | 4/2002 | Yokoyama et al. | 174/52.4 |
| 2002/0176933 A1 * | 11/2002 | Mifune et al. | 427/162 |
| 2005/0238803 A1 * | 10/2005 | Tremel et al. | 427/180 |
| 2006/0283546 A1 * | 12/2006 | Tremel et al. | 156/291 |
| 2006/0284556 A1 * | 12/2006 | Tremel et al. | 313/512 |
| 2008/0030654 A1 * | 2/2008 | Slutsky et al. | 349/70 |
| 2008/0171801 A1 * | 7/2008 | Cho et al. | 522/42 |
| 2008/0272694 A1 * | 11/2008 | Tremel | 313/553 |
| 2009/0160600 A1 * | 6/2009 | Yanagida et al. | 338/21 |
| 2009/0263587 A1 * | 10/2009 | Wang et al. | 427/385.5 |

FOREIGN PATENT DOCUMENTS

| | | |
|---|---|---|
| EP | 0 884 930 A1 | 12/1998 |
| WO | 01/19142 A1 | 3/2001 |
| WO | 02/43098 A1 | 5/2002 |

* cited by examiner

*Primary Examiner*—Joseph D Anthony

(57) ABSTRACT

The invention is directed to a screen-printable getter composition comprising: (a) glass frit; dispersed in (b) organic medium. The invention is further directed to a screen-printable thick film getter composition comprising: (a) glass frit; and (b) desiccant material; dispersed in (c) organic medium.

The present invention further relates to a getter composition utilizing low-softening temperature glasses comprising, based on weight %, 1-50% $SiO_2$, 0-80% $B_2O_3$, 0-90% $Bi_2O_3$, 0-90% PbO, 0-90% $P_2O_5$, 0-60% $Li_2O$, 0-30% $Al_2O_3$, 0-10% $K_2O$, 0-10% $Na_2O$, and 0-30% MO where M is selected from Ba, Sr, Ca, Zn, Cu, Mg and mixtures thereof. The glasses described herein may contain several other oxide constituents that can substitute glass network-forming elements or modify glass structure.

5 Claims, No Drawings

THICK FILM GETTER PASTE COMPOSITIONS FOR USE IN MOISTURE CONTROL

This application is a divisional of a U.S. patent application Ser. No. 10/712,670, filed on Nov. 13, 2003 now U.S. Pat. No. 7,438,829.

FIELD OF THE INVENTION

The invention is directed to thick film getter paste composition for use in controlling moisture in moisture sensitive devices.

BACKGROUND OF THE INVENTION

The invention describes a thick film getter composition for use in controlling moisture. Many environments are susceptible to unwanted moisture and this is especially so in the case of various electronic devices. In an effort to control unwanted moisture, the concept of using getter has been known for many years. Getters are substances which are added to a system or mixture to consume or inactivate traces of impurities.

One approach to minimizing the deleterious effects of moisture has involved the enclosure of moisture sensitive devices in a barrier to separate the active materials from oxygen and moisture. This approach has had some success, but it does not always adequately address the problems caused by even those small amounts of moisture trapped within the enclosure or diffusing into the enclosure over time.

The use of getters for controlling moisture within a sealed enclosure for an electronic component or device is well known. These sealed enclosures are designed to protect sensitive electronic components and devices from the outside environmental contaminants, including moisture. However, some electronic devices are highly sensitive to moisture and require moisture control to very low levels. At they same time, these electronic devices require that the getter composition be easily applied and processed while demonstrating that the processed composition sufficiently adheres to the desired substrate. The present invention provides a superior composition to accommodate these requirements.

The prior art materials associated with getters and their use in electronic applications have been described below. Typically, the getter materials not screen-printable compositions and are comprised of a desiccant material (i.e., zeolite, silica gel, etc.) and a binder. The binder may be organic or inorganic. The following illustrate the state of the prior art.

U.S. Pat. No. 5,244,707 to Shores discloses a sealed enclosure of an electronic device which incorporates a coating or adhesive with desiccant properties. The coating or adhesive comprises a protonated alumino silicate powder dispersed in polymer.

U.S. Pat. No. 5,591,379 to Shores teaches a composition of matter useful as a desiccant in a hermetic electronic device, comprising a powder dispersed in a binder, wherein said powder is selected from the group consisting of zeolite molecular sieves, activated alumina, silica gel, alkaline earth oxide, and alkali metal carbonate; said binder is a continuous matrix of porous glass or porous ceramic; and said powder to binder volume ratio is 0.001-2. The glasses disclosed for use as a binder must be made porous by creating channels for water vapor to penetrate. This may be done by various techniques known in the art, such as the use of blowing agents, fast evaporation of water or other gases during formation, fast decomposition of metalloorganic polymers and low temperature or incomplete sintering.

U.S. Pat. No. 1,626,682 to MacRae discloses a multi-pixel flat panel display means which include spaced apart first and second electrodes, with a patterned solid material layer in contact with one of the electrodes, exemplarily between the two electrodes. The patterned layer (the web) includes a multiplicity of apertures, with at least one aperture associated with a give pixel. In the aperture is disposed a quantity of a second material, exemplarily, a phosphor in the case of a flat panel field emission display, or a color filter material in the case of a liquid crystal display. The web can facilitate second material deposition by means of screen printing. The web also can facilitate provision of spacer structure between two electrodes, and can include getter or hygroscopic material.

U.S. Pat. No. 5,401,706 to Fischer teaches a process for making a desiccant-coated substrate capable of being used at temperatures over 150 degrees Fahrenheit, the desiccant being in the form of particles and the particles having pores and being adhered to the substrate by a binder, the coated substrate being sufficiently flexible and the coating having sufficient adherence to the substrate so that the coated substrate can be formed into corrugated shapes, the desiccant particles in the coated substrate having at least 60% of their original adsorption capacity and the binder having good breathability; said process comprising the steps: (a) forming an aqueous suspension comprising particles of one or more desiccants, a water-based organic binder, a suspending agent to help maintain the desiccant particles in suspension, and an organic pore-clearing agent at least some of which enters at least some of the pores of the desiccant particles; (b) depositing the suspension on the substrate; and (c) causing the binder of the deposited suspension to set so that the deposited desiccant particles adhere to the substrate and causing at least some of the pore-clearing agent to leave the pores of the desiccant particles to prevent the binder from occluding at least some of the pores of the adhered desiccant particles, thereby to form a desiccant-coated substrate capable of being used at temperatures over 150 degrees Fahrenheit and of sufficient flexibility and having a coating having sufficient adherence to the substrate so that the desiccant-coated substrate can be formed into corrugated shapes and in which the desiccant particles in the coated substrate have at least 60% of their original adsorption capacity and in which the binder has good breathability.

The present invention provides a screen-printable thick film getter composition comprising glass which may be used to promote densification at low densification temperature of 400-650° C. and to provide increased adhesion between the thick film and the substrate. Furthermore, the composition of the present invention may be utilized in display devices which often require humidity control to levels below about 1000 ppm and sometimes below even 100 ppm.

SUMMARY OF THE INVENTION

The invention is directed to a screen-printable getter composition comprising: (a) glass frit; dispersed in (b) organic medium. The invention is further directed to a screen-printable getter composition comprising: (a) glass frit; and (b) desiccant material; dispersed in (c) organic medium.

The present invention further relates to a getter composition utilizing low-softening temperature glasses comprising, based on weight %, 1-50% $SiO_2$, 0-80% $B_2O_3$, 0-90% $Bi_2O_3$, 0-90% PbO, 0-90% $P_2O_5$, 0-60% $Li_2O$, 0-30% $Al_2O_3$, 0-10% $K_2O$, 0-10% $Na_2O$, and 0-30% MO where M is selected from Ba, Sr, Ca, Zn, Cu, Mg and mixtures thereof. The glasses described herein may contain several other oxide constituents that can substitute glass network-forming elements or modify glass structure.

DETAILED DESCRIPTION OF INVENTION

The thick film getter composition of the present invention is a screen-printable ceramic composition, which may be formed on a substrate. For example, a glass substrate acting as a lid in various electronic display devices. The thick film getter acts as a water-absorbent at various environmental conditions of a few thousands ppm to a few ppm of humidity levels. The present invention is not limited to display device applications, but can be used for any other microelectronic device applications where the device lifetime can be degraded by or sensitive to the presence of moisture.

Furthermore, the present invention relates to the use of glass-containing composition, wherein no desiccant material is required, as a thick film getter or as an additive to promote densification of resultant thick films and adhesion between the thick film and substrate. The thick film getter, after firing at 400-650° C., demonstrates good densification and compatibility particularly with glass lid substrates associated with display device applications. The thick film getter paste is primarily intended to be used for various display applications including organic light emitting diodes (OLED) and electroluminescence (EL), where lifetime of the display devices are strongly related to the control of humidity and other harmful gases. The display applications differ from other hermetic microelectronic devices in that the moisture gettering is working at highly moisture-sensitive or gas-sensitive environments. The display devices often require humidity control to levels below about 1000 ppm and sometimes below even 100 ppm.

The main components of the thick film getter composition are a glass powder dispersed in an organic medium. The organic medium is comprised of organic polymeric binder and volatile organic solvent. In most applications, the composition may further comprise a desiccant material (for example, zeolite) or other material which absorbs impurities, such as hydrogen or other gases. Usually, the desiccant material is the main functional part of the thick film getter, which determines its performance of water absorption. Generally, the capacity of water absorption proportionally depends on the relative content of the desiccant material. Primarily, glass provides a low densification temperature of 400-650° C. and good adhesion between thick film and substrate. Firing temperature is limited by the choice of lid substrate, since the thick film paste is supposed to adhere to substrate through firing. For example, firing temperature needs to be below 650° C. if a typical glass substrate based on soda lime silicates is selected. Firing above 650° C. with the glass substrate may induce warping or distortion of the glass substrate. In case of LTCC or metal-based substrates, a temperature above 650° C. may be allowed.

Adhesion between the getter film and substrate is improved by the existence of the low softening glass. Glass can help relieve interface stress by facilitating penetration of glass into voids of substrates via viscous flow during firing. Mechanical locking is likely to be the dominant mechanism for adhesion between thick film and substrate. However, the adhesion mechanism depends on the choice of substrate.

In the present invention, the glass does not necessarily form a continuous matrix in unfired or fired structure. Before firing, the glass is dispersed in the organic media to form a viscous paste. Upon firing, glass tends to wet the surface of desiccant particles or the surface of the substrate and be densified by viscous flow. The evaporation of organic media occurs before the actual consolidation of solid particles. The final fired structure must depend on the relative content of solids.

The glass itself is not porous and it is not necessary to produce the glass by a special fabrication process, such as fast evaporation of water or glasses, the use of blowing or bubbling agents, any chemical hollow process and low temperature firing, to intentionally generate pores in the glass. Rather, it is important to achieve a highly dense or essentially void-free structure with the proper choice of glass chemistry.

The hardness and mechanical strength of the film primarily depend on the content and type of glass. The mechanical integrity is assumed to be important because weak film structure can be damaged by an external mechanical shock. It is not necessary to maintain high levels of porosity for better performance of moisture absorption, particularly when a highly moisture sensitive device working at a humidity level lower than 1000 ppm is used. In the device at humidity levels below 1000 ppm, the glass paste itself (without desiccant material) may be utilized as a functional getter. A proper choice of glass with strong hygroscopic nature is required. The pure glass getter film provides a glass composition which is not essentially porous and further allows strong integrity with the substrate without any defects.

The thick film getter composition, as described herein, is bonded to substrate by depositing the thick film composition onto the substrate and firing the substrate. Depending on device structure and required performance, thickness of the getter film may be controlled by the sequential depositions of the paste. A typical thickness of the thick film getter after single printing and subsequent firing ranges from 10 μm to 25 μm. An excessive thickness does not need to be considered as long as strong absorption of moisture is required.

Although screen printing is expected to be a common method for the deposition of thick film getter, any other conventional methods including stencil printing, syringe dispensing or other deposition or casting techniques may be utilized.

This invention is based on the finding that thick film getter compositions (sometimes referred to as "pastes") can be made by combining low softening temperature glasses with or without desiccant material in an organic medium. The composition of the invention is described in further detail below.

Inorganic Composition

The inorganic composition of thick film getter paste is comprised of a glass frit powder and may further comprise a desiccant material.

The glass frit powder is essential to the composition to promote adhesion to the substrate and densification of the composition upon processing. In addition, the glass itself can act as a getter particularly in a highly moisture-sensitive devices at a humidity level lower than 1000 ppm. Therefore, adequate levels of glass must be within the range of 10 wt % to 100 wt %, based on solid wt. %.

The present invention relates to low-softening temperature glasses comprising, based on weight %, 1-50% $SiO_2$, 0-80% $B_2O_3$, 0-90% $Bi_2O_3$, 0-90% PbO, 0-90% $P_2O_5$, 0-60% $Li_2O$, 0-30% $Al_2O_3$, 0-10% $K_2O$, 0-10% $Na_2O$, and 0-30% MO where M is selected from Ba, Sr, Ca, Zn, Cu, Mg and mixtures thereof. The glasses described herein may contain several other oxide constituents. For instance $ZrO_2$ and $GeO_2$ may be partially incorporated into the glass structure. Hygroscopic lithium-based silicates or phosphate glasses may also be applied for the getter purpose. Furthermore, the glass compositions of the present invention are not essentially porous glasses. Therefore, the glass compositions of the present invention are not required to be made porous by creating channels for water vapor to penetrate.

High contents of Pb, Bi or P in glass provide a very low softening point that allow thick film pastes to become dense below 650° C. These glasses are not crystallized during firing, since the elements tend to provide good stability of glass and a high solid solubility for other glass elements. In addition, the existence of a large content of phosphorous may be useful in gettering moisture without affecting the degree of densification. Li-based silicate glasses may also be used in this application, since they are sensitive to moisture and can be densified at low temperature below 650° C. However, the content of Li may need to be optimized for full densification before crystallization happens.

Other glass modifiers or additives may be added to modify glass properties for better compatibility with a given substrate. For example, Temperature Coefficient of Expansion (TCE) of the glass may be controlled by the relative content of other glass components in the low-softening temperature glasses.

The glasses described herein are produced by conventional glass making techniques. More particularly, the glasses may be prepared as follows. The glasses were typically prepared in 500-2000 gram quantities. Typically, the ingredients were weighted then mixed in the desired proportions and heated in a bottom-loading furnace to form a melt in platinum alloy crucibles. Heating was typically conducted to a peak temperature (1100-1400° C.) and for a time such that the melt becomes entirely liquid and homogeneous. The glass melts were quenched by a counter rotating stainless steel roller to form a 10-20 mil thick platelet of glass. The resulting glass platelet was then milled to form a powder with its 50% volume distribution set between 2-5 microns. The glass powders were then formulated with filler and organic medium into a thick film composition (or "paste"). The glass composition of the invention at hand, is present in the amount of about 5 to about 76 wt. %, based on total composition comprising, glass, desiccant material, and organic medium.

Various desiccant materials such as molecular sieves (or zeolites), alkaline earth metal oxides, metal oxides, sulfates, chlorides, bromides may be selected for getter paste applications. Various types of zeolites are known to be the best candidates in terms of capacity of water absorption due to their intrinsic nature of porous structure.

Zeolites are materials that absorb moisture by physical absorption and may be naturally or synthetically derived. Natural zeolites are hydrated silicate of aluminum and either sodium or calcium or both, of the type $Na_2O$, $Al_2O_3$, $xH_2O$, and $xSiO_2$. Synthetic zeolites are made either by a gel process or a clay process, which forms a matrix to which the zeolite is added. Both natural and synthetic zeolites may be used in the present invention. Well known zeolites include chabazite (also referred to as zeolite D), clinoptilolite, erionite, faujasite (also referred to as zeolite X and zeolite Y), ferrierite, mordenite, zeolite A, and zeolite P. Detailed descriptions of the above-identified zeolites, as well as others, may be found in D. W. Breck, *Zeolite Molecular Sieves*, John Wiley and Sons, New York, 1974, hereby incorporated by reference. For example, type 3A, 4A and 13X zeolites all have the ability to adsorb water molecules and are presently preferred as the adsorbent molecular sieve for making the new moisture getters. Such zeolites comprise $Na_2O$, $Al_2O_3$ and $SiO_2$. Certain adsorbent getters can adsorb gaseous contaminants in addition to moisture, such as gaseous $H_2$ and $O_2$. An example of a commercially available, solid getter tablet based on zeolite technology that can be made to adsorb organics, as well as moisture is described in European Patent Application No. WO 02/43098 A1 by Synetix.

The amount of dessicant material added to the composition should be determined based on the necessary capacity to absorb moisture, as dictated by the application. The approximate volume % ratio of dessicant to glass frit ranges from 0 to about 15. The preferred volume % ratio of dessicant to glass frit ranges from 2.1 to 10.

Organic Medium

The organic medium in which the glass and desiccant materials are dispersed is comprised of the organic polymeric binder which is dissolved in a volatile organic solvent and, optionally, other dissolved materials such as plasticizers, release agents, dispersing agents, stripping agents, antifoaming agents and wetting agents.

The solids are typically mixed with an organic medium by mechanical mixing to form a pastelike composition, called "pastes", having suitable consistency and rheology for printing. A wide variety of inert liquids can be used as organic medium. The organic medium must be one in which the solids are dispersible with an adequate degree of stability. The rheological properties of the medium must be such that they lend good application properties to the composition. Such properties include: dispersion of solids with an adequate degree of stability, good application of composition, appropriate viscosity, thixotropy, appropriate wettability of the substrate and the solids, a good drying rate, good firing properties, and a dried film strength sufficient to withstand rough handling. The organic medium is conventional in the art and is typically a solution of the polymer in solvent(s).

The most frequently used polymer for this purpose is ethyl cellulose. Other examples of suitable polymers include ethylhydroxyethyl cellulose, wood rosin, mixtures of ethyl cellulose and phenolic resins, polymethacrylates of lower alcohols, and monobutyl ether of ethylene glycol monoacetate, as well as others known to those skilled in the art, may also be used.

The most widely used solvents found in thick film compositions are ethyl acetate and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. The preferred mediums are based on ethylcellulose and β-terpineol. Various combinations of these and other solvents are formulated to obtain the viscosity and volatility requirements desired.

The ratio of organic medium in the thick film composition to the inorganic solids in the dispersion is dependent on the method of applying the paste and the kind of organic medium used, and it can vary. Usually, the dispersion will contain 50-80 wt. % of inorganic solids and 20-50 wt. % of vehicle in order to obtain good coating. Within these limits, it is desirable to use the least possible amount of binder vis-à-vis solids in order to reduce the amount of organics which must be removed by pyrolysis and to obtain better particle packing which gives reduced shrinkage upon firing. The content of the organic medium is selected to provide suitable consistency and rheology for casting, printing, such as silk screen printing or ink-jet printing, or coating by spraying, brushing, syringe-dispensing, doctor blading, and the like.

In addition, the proportion of dispersing organic medium in the getter paste may control the thickness of the solidified layer of absorbent getter. For example, a thick film paste with minimized organic medium results in formation of a thicker getter layer (such dispersions are subject to shear-thinning and hence become thinner as the dispersion is worked on the surface).

Application of Thick Films

The thick film getter is typically deposited on a substrate, such as glass, low temperature co-fired ceramics (LTCC) or silicone, that is impermeable to gases and moisture. The substrate can also be a sheet of flexible material, such as an impermeable plastic such as polyester, for example polyethylene terephthalate, or a composite material made up of a combination of plastic sheet with optional metallic or dielectric layers deposited thereupon. In one embodiment, the substrate can be transparent (or semitransparent) to enable light to enter into the encapsulated region or to enable light to be emitted from the encapsulated region through the substrate.

The deposition of thick film getter is performed preferably by screen printing although other deposition techniques such as stencil printing, syringe dispensing or other deposition or casting techniques can be utilized. In case of screen-printing, the screen mesh size controls the thickness of deposited thick film.

The deposited thick film is dried at 100-120° C. in an oven to remove volatile organic medium, and then firing is carried out at 400-650° C. in a standard thick film conveyor belt furnace or in a box furnace with a programmed heating cycle forming a fired article. As used herein, the term "firing" means heating the article in an oxidizing or inert atmosphere such as air, nitrogen or argon to a temperature and for a time sufficient to volatilize (burn-out) the organic material in the layers of the assemblage and to sinter any glass-containing material in the layers thus, densifying the thick film layer.

Fired thickness of the film can vary depending on screen mesh size, content of glass and solid % in paste, but typically ranges from 10 µm to 25 µm. To prevent readsorption of volatiles (and de-activation of the zeolite), the firing (or densifying) step is often conducted in a controlled atmosphere void of moisture and other gases, such as under vacuum. The firing step is usually performed immediately prior to sealing the device into the hermetic container unless the fired getter is stored in an atmosphere void of moisture and/or other gases. Depending on processing procedure, an additional firing at 400-550° C. for activation of getter may be required to evaporate absorbed moisture.

The humidity sensitivity of fired getter thick films was evaluated by exposing the getter composition to changing humidity conditions, such as different humidity levels, exposure time, and temperature. The thermal gravimetry analysis (TGA) analysis was used to quantify the weight loss up to a certain temperature. The evaluation results showed the identical decreasing tendency of weight loss with increasing the glass content. In addition, it revealed that most of humidity absorption occurred within a relatively short time of less than 1 hour of exposure.

The present invention will be discussed in further detail by giving practical examples. The scope of the present invention, however, is not limited in any way by these practical examples.

EXAMPLES

Examples 1-3

A series of bismuth silicate-based glass compositions that have been found to be suitable in the present invention for application to thick film getter paste are shown in Table 1. The examples particularly illustrate silicate glasses containing more than 69 wt. % bismuth.

All glasses were prepared by mixing raw materials and then melting in a platinum crucible at 1100-1400° C. The resulting melt was stirred and quenched by pouring on the surface of counter rotating stainless steel rollers or into a water tank. The glass powders prepared for the invention were adjusted to a 2-5 µm mean size by wet or dry milling using alumina ball media prior to formulation as a paste. The wet slurry after milling was dried in a hot air oven and deagglomerated by the sieving process.

TABLE 1

| | Glass composition in weight % | | |
|---|---|---|---|
| Ex. # | 1 | 2 | 3 |
| $SiO_2$ | 7.1 | 15.8 | 3.5 |
| $Al_2O_3$ | 2.1 | 2.6 | 3.5 |
| $Bi_2O_3$ | 69.8 | 81.6 | 82.0 |
| $B_2O_3$ | 8.4 | | |
| CaO | 0.5 | | |
| ZnO | 12.0 | | |
| PbO | | | 11.0 |

Examples 4-7

Table 2 represents a series of lead or phosphorous-based silicate glass compositions that have been found to suitable for this getter application. The same processing as described in Example 1-3 was applied to make glass frit powders of a 2-5 µm mean size.

TABLE 2

| | Glass composition in weight % | | | |
|---|---|---|---|---|
| Ex. # | 4 | 5 | 6 | 7 |
| $SiO_2$ | 14.8 | 9.1 | 35.6 | 1.3 |
| $Al_2O_3$ | 0.8 | 1.4 | 7.6 | 19.8 |
| PbO | 66.0 | 77.0 | 47.0 | |
| $B_2O_3$ | 11.8 | 12.5 | | 6.8 |
| ZnO | 6.6 | | | |
| $SnO_2$ | | | 9.8 | |
| $Na_2O$ | | | | 9.8 |
| $Li_2O$ | | | | 3.7 |
| $P_2O_5$ | | | | 42.23 |
| NaF | | | | 16.41 |

Examples 8-18

Thick film getter paste was prepared by mixing glass and desiccant (4 A or 13x powder) material (molecular sieve) with organic media based on the mixture of Texanol® solvent and ethyl cellulose resin. Table 3 represents the examples of thick film compositions containing 5-76% glass. Different levels of glass relative to desiccant were applied for optimized performance. Particularly, examples 10 and 18 demonstrate thick film compositions containing only glass and organic media. Changing the content of solvent was necessary to adjust paste viscosity and film thickness for different deposition methods.

The getter paste was printed using a 200 mesh screen on a glass lid substrate based on soda-lime silicates, dried at 120°

C. for solvent evaporation, and then fired at a peak temperature of 450-550° C. for 1-2 hours in a box furnace. Some samples were also processed at 550° C. for 1 hour using a conveyor furnace with a heating/cooling profile of about 6 hours. The printing/firing step was repeated to generate thicker getter films when needed. The fired thickness of single-printed thick film ranged from 10 µm to 25 µm, depending on paste viscosity and screen mesh size.

The thick film fired dense and showed good adhesion with the glass substrate. No cracking or blistering was observed on the surface of fired thick films. Good thickness uniformity of fired film was kept within +/−2 µm regardless of paste composition.

The densification degree of fired samples depended on the relative content of glass. A higher content of glass was desirable for better densification of thick films and stronger bonding to the glass lid substrate.

The moisture absorption of getter paste was found to depend strongly on temperature and relative content of glass as seen in the examples 19-24. The weight loss proportionally increased with increasing temperature as expected, but it tends to show the saturation of weight loss after 400° C. Increasing the content of glass decreased drastically the percentage of weight loss. For example, a weight loss of 16% was detected for the sample containing 28.6% glass according to TGA up to 400° C., while only 0.4% weight loss for the 66.7% glass composition. This tendency is reasonable when considered the fact that the absorption capability is dominantly determined by the relative content of desiccant materials. The glass is believed to generally act as an inorganic binder and/or an adhesion promoter while it degrades the capability of water absorption as the glass example 1 basically does not have water absorption capability as seen in Example 24.

TABLE 3

Thick film getter composition in weight %

| | Ex. # | | | | | | | | | |
|---|---|---|---|---|---|---|---|---|---|---|
| | 8 | 9 | 10 | 11 | 12 | 13 | 14 | 15 | 16 | 17 | 18 |
| | | | | | | Glass. # | | | | | |
| | 1 | 1 | 1 | 2 | 3 | 4 | 5 | 5 | 6 | 6 | 7 |
| Glass | 5.4 | 14.0 | 75.8 | 19.6 | 19.6 | 17 | 8.9 | 19.6 | 8.9 | 19.6 | 75.8 |
| Molecular | 54.1 | 46.5 | — | 39.2 | 39.2 | 42.6 | 44.4 | 39.2 | 44.4 | 39.2 | — |
| Surfactant | 1.1 | 0.9 | — | 0.8 | 0.8 | 0.9 | 0.9 | 0.8 | 0.9 | 0.8 | — |
| Binder Resin | 1.0 | 0.9 | 1.4 | 0.7 | 0.7 | 0.8 | 0.8 | 0.7 | 0.8 | 0.7 | 1.4 |
| Solvent | 38.4 | 37.7 | 22.8 | 39.7 | 39.7 | 38.8 | 45 | 39.7 | 45 | 39.7 | 22.8 |

Examples 19-25

Fired thick film samples were evaluated to quantify the degree of moisture absorption after exposure to certain humidity environment. Table 4 shows the absorption performance of selected getter samples based on the thermal gravimetry analysis (TGA) results. The absorption results were expressed as weight loss of thick films up to a given temperature. The TGA samples were prepared by firing at 550° C. for 2 hours and exposing to an 85° C./85% RH humidity condition for 1 hour. No additional firing for activation was used for the TGA analysis.

On the other hand, it is interesting to demonstrate that Example 25 based on phosphorous glass (Example 7) without molecular sieve showed considerable amounts of water absorption depending on firing temperature. It indicates that pure glass-based materials can be used for moisture-gettering purpose especially for highly moisture-sensitive devices. It is noticeable that Example 25 showed better water absorption percentages compared to Example 23 containing 33 wt. % molecular sieve.

TABLE 4

Thick Film getter composition in weight % (based on solid %) and weight loss in %

| | Ex. # | | | | | | |
|---|---|---|---|---|---|---|---|
| | 19 | 20 | 21 | 22 | 23 | 24 | 25 |
| | | | | Glass # | | | |
| | 1 | 1 | 1 | 1 | 1 | 1 | 7 |
| Glass | 28.6% | 37.5% | 44.5% | 50.0% | 66.7% | 100% | 100% |
| Molecular Sieve | 71.4% | 62.5% | 55.5% | 50.0% | 33.3% | | |
| | | | Weight Loss by TGA | | | | |
| Up to 100° C. | 4.0% | 5.5% | 3.7% | 1.3% | 0.2% | 0% | 0.4% |
| Up to 200° C. | 13.0% | 13.5% | 10.7% | 3.6% | 0.4% | 0% | 1.2% |
| Up to 300° C. | 16.0% | 15.0% | 12.5% | 4.1% | 0.5% | 0.01% | 1.5% |
| Up to 400° C. | 16.4% | 15.5% | 12.8% | 4.2% | 0.6% | 0.05% | 1.6% |
| Up to 500° C. | 16.6% | 15.5% | 13.0% | 4.3% | 0.6% | 0.06% | 1.7% |

What is claimed is:

1. An article comprising a substrate bonded with a sintered thick film hygroscopic getter composition, said thick film hygroscopic getter composition consisting of:
   (a) hygroscopic bismuth silicate-based glass frit comprising more than 69 wt. % $Bi_2O_3$ and 0.8-30 wt. % $Al_2O_3$ dispersed in
   (b) organic medium comprising an organic polymeric binder and a volatile organic solvent,
   wherein the organic polymeric binder is selected from the group consisting of ethyl cellulose, ethylhydroxyethyl cellulose, wood rosin, mixtures of ethyl cellulose and phenolic resins, polymethacrylates of lower alcohols, monobutyl ether of ethylene glycol monoacetate, and mixtures thereof;
   wherein the volatile organic solvent is selected from the group consisting of ethyl acetate, terpenes, kerosene, dibutylphthalate, butyl carbitol, butyl carbitol acetate, hexylene glycol, high boiling alcohols, alcohol esters, and mixtures thereof, and;
   wherein said thick film hygroscopic getter composition is bonded to the substrate by depositing the thick film hygroscopic getter composition onto the substrate, followed by volatilizing the organic medium and sintering the glass frit to form an essentially non-porous layer of thickness from 10 µm to 25 µm.

2. The article of claim 1 comprising a hygroscopic getter composition, wherein the organic medium comprises 30-55% weight percent, based on the total weight of the composition.

3. The article of claim 1 comprising a hygroscopic getter composition,
   wherein the hygroscopic glass frit comprises 5-55 weight percent, based on the total weight of the composition.

4. The article of claim 1 comprising a hygroscopic getter composition, wherein the hygroscopic glass frit comprises, based on weight of the hygroscopic glass frit 1-50% $SiO_2$, 0-80% $B_2O_3$, 0-90% PbO, 0-90% $P_2O_5$, 0-60% $Li_2O$, 0-10% $K_2O$, 0-10% $Na_2O$, and 0-30% MO where M is selected from Ba, Sr, Ca, Zn, Cu, Mg and mixtures thereof.

5. The article of claim 1 comprising a hygroscopic getter composition, wherein the hygroscopic getter composition has been fired at 400° C. to 650° C. and is attached to a substrate.

* * * * *